(12) United States Patent
Bamji et al.

(10) Patent No.: US 9,497,440 B2
(45) Date of Patent: Nov. 15, 2016

(54) BURST-MODE TIME-OF-FLIGHT IMAGING

(71) Applicant: MICROSOFT TECHNOLOGY LICENSING, LLC, Redmond, WA (US)

(72) Inventors: Cyrus Bamji, Fremont, CA (US);
Tamer Elkhatib, San Jose, CA (US);
Swati Mehta, Palo Alto, CA (US);
Zhanping Xu, Sunnyvale, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 692 days.

(21) Appl. No.: 13/857,946

(22) Filed: Apr. 5, 2013

(65) Prior Publication Data

US 2014/0300700 A1 Oct. 9, 2014

(51) Int. Cl.
*H04N 13/02* (2006.01)
*G01S 17/36* (2006.01)
*G01S 17/89* (2006.01)
*G01S 7/486* (2006.01)
*H01L 27/146* (2006.01)

(52) U.S. Cl.
CPC ......... *H04N 13/0203* (2013.01); *G01S 7/4863* (2013.01); *G01S 7/4865* (2013.01); *G01S 17/36* (2013.01); *G01S 17/89* (2013.01); *H01L 27/14609* (2013.01)

(58) Field of Classification Search
CPC .... G01S 7/4816; G01S 17/10; G01S 7/4863; G01S 17/89; H04N 5/335; H04N 13/0207; H04N 13/0253; H04N 3/155; H01L 27/14643
See application file for complete search history.

(56) References Cited

U.S. PATENT DOCUMENTS

| 6,515,740 | B2 | 2/2003 | Bamji et al. |
| 7,439,509 | B1 | 10/2008 | Grazioso et al. |
| 7,688,944 | B2 | 3/2010 | Ritman |
| 7,994,465 | B1 | 8/2011 | Bamji et al. |

(Continued)

FOREIGN PATENT DOCUMENTS

CN 102057295 A 5/2011

OTHER PUBLICATIONS

Tomonari Sawada et al "TOF range image sensor using a range-shift technique" 2008 IEEE Sensors, Lecce, Italy, IEEE, Piscataway, NJ, USA, Oct. 26, 2008, pp. 1390-1393, XP031375344, ISBN: 978-1-4244-2580-8.*

(Continued)

*Primary Examiner* — Luke Ratcliffe
(74) *Attorney, Agent, or Firm* — Gregg Wisdom; Judy Yee; Micky Minhas

(57) ABSTRACT

An imager includes an emitter, an array of pixel elements, and driver logic. The emitter releases bursts of light pulses with pauses between bursts. Each element of the array has a finger gate biasable to attract charge to the surface, a reading node to collect the charge, and a transfer gate to admit such charge to the reading node and to deter such charge from being absorbed into the finger gate. The driver logic biases the finger gates with the modulated light pulses such that the finger gates of adjacent first and second elements cycle with unequal phase into and out of a charge-attracting state. To reduce the effects of ambient light on the imager, the driver logic is configured to bias the transfer gates so that the charge is admitted to the reading node only during the bursts and is prevented from reaching the reading node during the pauses.

18 Claims, 12 Drawing Sheets

(56) References Cited

U.S. PATENT DOCUMENTS

| | | | |
|---|---|---|---|
| 2002/0084430 A1 | 7/2002 | Bamji et al. | |
| 2003/0223053 A1 | 12/2003 | Liu et al. | |
| 2007/0158770 A1* | 7/2007 | Kawahito | G01S 7/4816 |
| | | | 257/431 |
| 2010/0020306 A1 | 1/2010 | Hall | |
| 2011/0019049 A1 | 1/2011 | Jin et al. | |
| 2011/0205522 A1 | 8/2011 | Snow et al. | |
| 2012/0008128 A1 | 1/2012 | Bamji | |
| 2012/0173184 A1 | 7/2012 | Ovsiannikov et al. | |
| 2012/0175685 A1 | 7/2012 | Kim et al. | |
| 2012/0188530 A1 | 7/2012 | Bamji et al. | |
| 2012/0249740 A1 | 10/2012 | Lee et al. | |

OTHER PUBLICATIONS

IPEA European Patent Office, Written Opinion Issued in PCT Application No. PCT/US2014/032296, Feb. 18, 2015, WIPO, 6 Pages.

IPEA European Patent Office, International Preliminary Report on Patentability Issued in PCT Application No. PCT/US2014/032296, Jun. 23, 2015, WIPO, 6 Pages.

Conroy, et al., "A Power-Saving Modulation Technique for Time-of-Flight Range Imaging Sensors", Retrieved at <<http://researchcommons.waikato.ac.nz/bitstream/handle/10289/5426/Conroy%202011%20A%20Power-Saving%20Modulation.pdf?sequence=1>>, In Videometrics, Range Imaging, and Applications XI, Jun. 9, 2011, p. 13.

Niclass, et al., "A CMOS 3D Camera with Millimetric Depth Resolution", Retrieved at <<http://aqua.epfl.ch/files/content/sites/aqua/files/groups/AQUA/public/Research/CMOS3D/CICC04.pdf>>, In IEEE Conference Custom Integrated Circuits, Oct. 3, 2004, pp. 4.

ISA European Patent Office, International Search Report & Written Opinion for PCT Patent Application No. PCT/US2014/032296, Jul. 28, 2014, WIPO, 11 Pages.

Sawada et al., "TOF Range Image Sensor Using A Range-Shift Technique", In IEEE Sensors, Oct. 26, 2008, pp. 1390-1393.

The State Intellectual Property Office of China, First Office Action and Search Report Issued in Chinese Patent Application No. 201480020206.9, Sep. 9, 2016, China, 15 pages.

* cited by examiner

BURST-MODE TIME-OF-FLIGHT IMAGING

BACKGROUND

In time-of-flight (TOF) depth imaging, a subject is irradiated by pulsed or modulated light from an emitter. Some of this light reflects back from the subject to an imaging photodetector. The pixel elements of the photodetector are addressed in groups, in synchronicity with the pulsed output of the emitter. In some variants, the integration periods for each group of pixel elements differ by a predetermined amount. Accordingly, a pixel-resolved time of flight of the pulses, from their origin at the emitter, out to the subject, and back to the photodetector, is discernible based on the relative amounts of light received in corresponding elements of the different groups. From the time of flight computed for a given pixel, the depth of the locus of the subject imaged by that pixel—i.e., the distance away from the photodetector—can be computed.

In the approach summarized above, the signal-to-noise ratio for depth measurement is reduced in the presence of broadband ambient light. In principle, the signal-to-noise ratio can be improved by increasing the output power of the emitter, such that the reflected light from the emitter overwhelms the ambient light. However, increasing emitter power may also increase the size, complexity, and cost of the imaging system.

SUMMARY

One embodiment of this disclosure provides a TOF depth imager comprising an emitter, an array of pixel elements, and driver logic. The emitter is configured to release repeating bursts of modulated light pulses with a pause between consecutive bursts. Formed on a semiconductor surface, each element of the array has a finger gate biasable to attract photogenerated charge to the surface, a reading node to collect charge attracted to the surface, and a transfer gate biasable to admit such charge to the reading node and to deter such charge from being absorbed into the finger gate. The driver logic is configured to bias the finger gates of the elements of the array in synchronicity with the modulated light pulses from the emitter such that the finger gates of adjacent first and second elements cycle with unequal (e.g., complementary) phase into and out of a charge-attracting state. The driver logic is further configured to bias the transfer gates so that the charge is admitted to the reading node only during the bursts and is prevented from reaching the reading node during the pauses.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
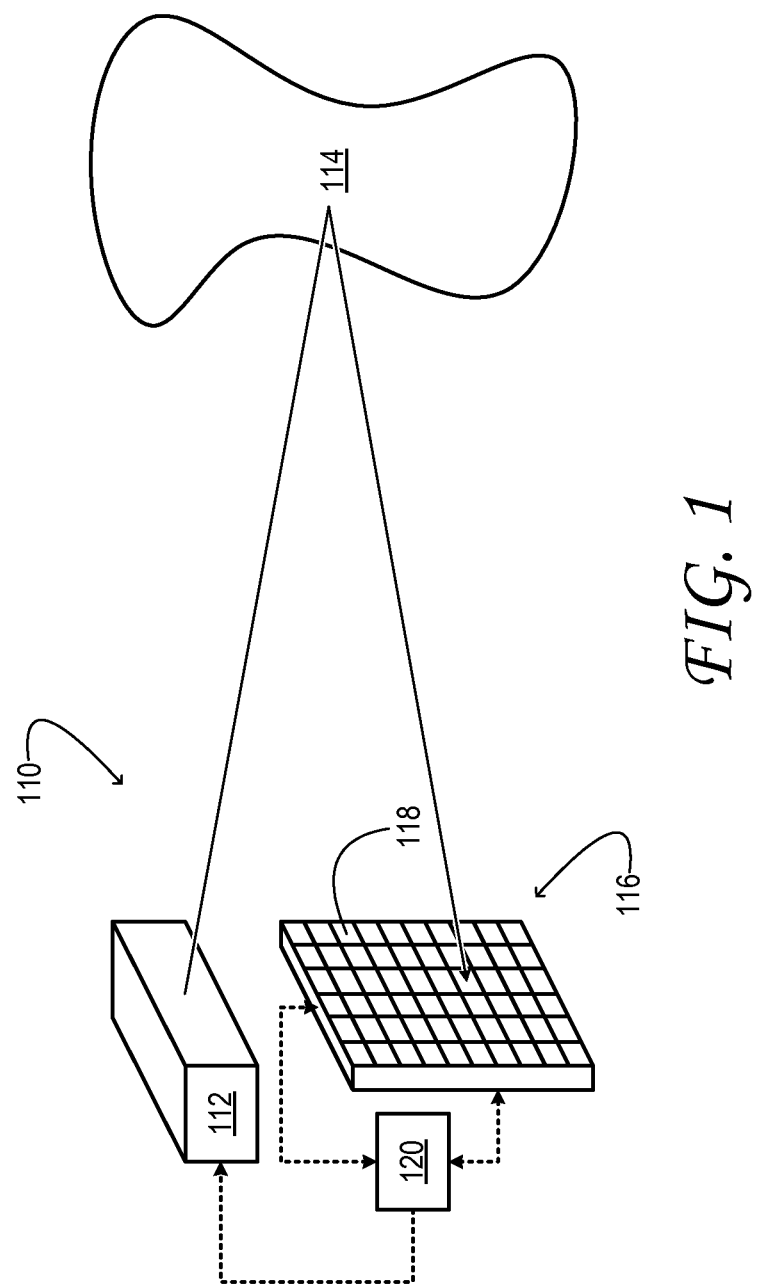
FIG. 1 shows aspects of a time-of-flight depth imager in accordance with an embodiment of this disclosure.

Aspects of this disclosure will now be described by example and with reference to the illustrated embodiments listed above. Components that may be substantially the same in one or more embodiments are identified coordinately and are described with little repetition. It will be noted, however, that elements identified coordinately may also differ to some degree. It will be further noted that the drawing figures included in this disclosure are schematic and generally not drawn to scale. Rather, the various drawing scales, aspect ratios, and numbers of components shown in the figures may be purposely distorted to make certain features or relationships easier to see.

FIG. 1 shows aspects of an example time-of-flight depth imager 110 in one embodiment. The depth imager includes an emitter 112 configured to irradiate subject 114 with modulated light—sinusoidally modulated, pulse modulated, or modulated according to any other periodic waveform. In a more particular embodiment, the emitter may be a programmable near-infrared laser capable of emitting in a continuous-modulation mode or in a repeating-burst mode. Continuing in FIG. 1, some modulated light from the emitter reflects back from the subject to imaging photodetector array 116, which includes an array of pixels 118. Because the light pulses received at the photodetector array have traveled out to the subject and back, they differ in phase from the pulse train released by the emitter. The phase difference varies (e.g., increases) in proportion to the distance the subject is from the depth imager, but wraps upon reaching a $2\pi$ radian phase shift. By determining the phase shift for each pixel of the array, a depth map of the imaged subject can be computed. Driver 120 provides synchronized drive signals to the emitter and to the array for the purpose of determining the phase shift.

To provide some measure of ambient-light rejection, photodetector array 116 may be arranged behind an optical band-pass filter (not shown in the drawings). Accordingly, the photodetector array may be substantially insensitive to light outside the narrow passband of the filter. Preferably, the passband is chosen to match the emission wavelength band of emitter 112. In one embodiment, the emitter may be a narrow-band infrared (IR) emitter such as an IR laser or IR light-emitting diode (LED). Irradiance and photodetection in the IR provides an additional advantage in that a human subject will not detect the irradiance from the emitter.

With respect to the pulsed output of emitter 112, this disclosure embraces a broad range of output power and modulation pulse width. In one non-limiting embodiment, the pulse width may be one half of the reciprocal of the modulation frequency. Along with the output power, the modulation frequency appropriate for a given depth-sensing application depends on the distance between subject 114 and depth imager 110. For distances on the order of three meters, each modulation cycle of the emitter may be 20 nanoseconds (ns); the ON pulse width within that modulation cycle may be about 10 ns, for a 50% duty cycle. It will be noted, however, that other ranges and modulation frequencies are fully consistent with the spirit and scope of this disclosure.

Even when the photodetector response is limited to a narrow wavelength band, the signal-to-noise ratio for depth imaging is reduced in the presence of broadband ambient-light, especially sunlight. One way to reduce the effect of ambient light on the signal-to-noise ratio is to reduce by a given factor the integration time of the photodetector array while increasing the output power of emitter 112 by the same factor. In this approach, the amount of signal light integrated at the array is unchanged, but the amount of ambient light is reduced by the given factor. One way to coerce higher output power from a laser or LED emitter is to operate the emitter in burst mode. In burst mode, the emitter is configured to release repeating bursts of modulated light pulses with a pause between consecutive bursts. In some embodiments, the repeating bursts may be periodic, as described below. Meanwhile, the photodetector is gated to integrate only during the bursts, not during the pauses.

Figure 2:
FIG. 2 is a graph of power output versus time for an emitter operating in normal modulation mode.
Figure 3:
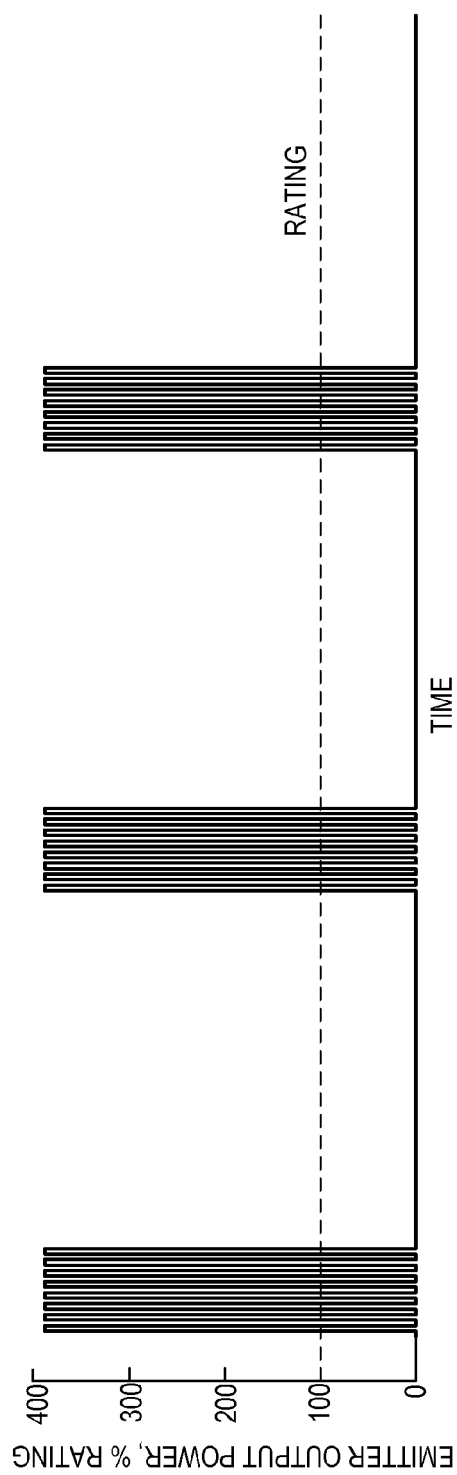
FIG. 3 is a graph of power output versus time for an emitter operating in burst mode in accordance with an embodiment of this disclosure.

Burst-mode operation is illustrated by example with reference to FIGS. 2 and 3. FIG. 2 shows power output versus time for an emitter operating in normal pulse mode at 10% below its average power rating. FIG. 3 shows power output versus time for the same emitter operating in burst mode. In burst mode, the emitter emits relatively short bursts of pulses in which the average power rating is exceeded. Each burst is followed by a pause which is several times longer than the burst—e.g., 4, 5 or 10× longer. As noted above, the peak power of the pulses within the burst may be correlated to the duty cycle of the burst to provide unchanged overall signal power with reduced sensitivity to ambient light. For example, the peak power may be increased fivefold over the rated value and the duty cycle (burst time versus burst time+pause time) reduced to about 20%. During the pause, the emitter, its power supply, and associated componentry dissipate excess heat generated during the high-power bursts. Accordingly, over a period of N bursts and N pauses, the average power rating of the various components will not be exceeded. In some embodiments, each burst may last 1 to 20 microseconds (µs), and, depending on the modulation frequency, may include about 5000 pulses. In some embodiments, each pause may last anywhere from about 5 to 200 µs. In another embodiment, each burst may last 0.5 to 50 µs, and each pause may last anywhere from 2 to 500 µs. The large number of pulses per burst provides an advantage in that more accurate phase data can be extracted from the pixel elements of the array.

The approaches described herein are well-suited to phase-based techniques, which may include harmonic cancellation. As such, measurement accuracy may be driven by the modulation frequency and relatively immune to changes in the modulation waveform shape, due to temperature and waveform drift. This is a significant advantage over related pulse-based methods, where such shifts in waveform shape may be compensated, if possible, by calibration.

Figure 4:
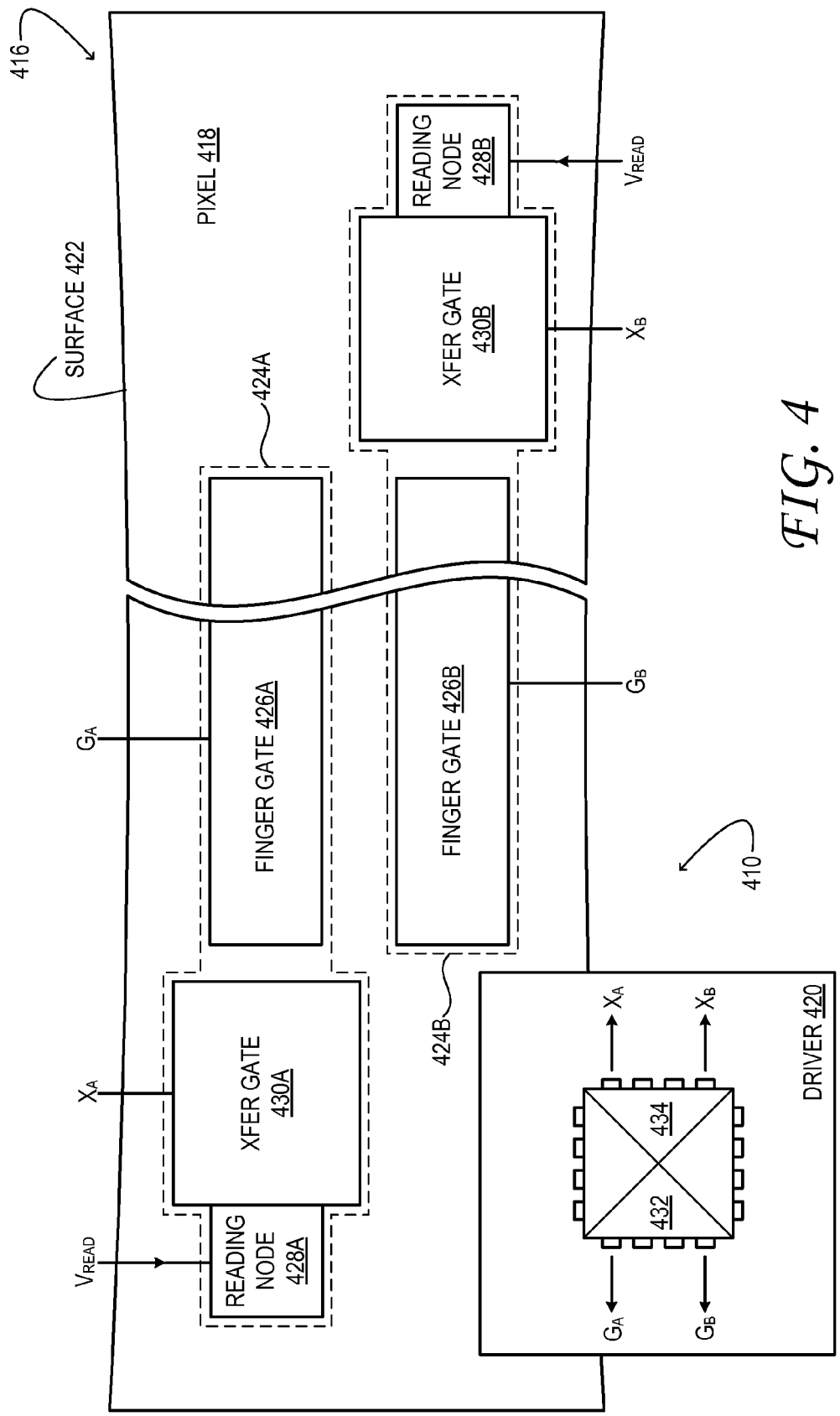
FIG. 4 shows aspects of a time-of-flight depth imager in accordance with an embodiment of this disclosure.

FIG. 4 shows aspects of an example TOF imager 410 in one embodiment. In this imager, photodetector array 416 is built upon an epitaxial surface 422, which is formed on a semiconductor substrate. FIG. 4 shows only a small portion of the array, which corresponds to one pixel 418. In the embodiment of FIG. 4, this pixel is comprised of two pixel elements, 424A and 424B (enclosed by dashed lines in the drawing). Pixel element 424A includes a polysilicon finger gate 426A biasable to attract photogenerated charge to the surface, a reading node 428A to collect the photogenerated charge attracted to the surface, and a transfer gate 430A biasable to admit such charge to the reading node when the finger gate is low and to deter such charge from being absorbed into the finger gate when the finger gate is high. In like manner, adjacent pixel element 424B includes finger gate 426B, reading node 428B, and transfer gate 430B. It will be noted that the terms 'charge' and 'photogenerated charge' are used herein to denote the minority charge carrier in the semiconductor substrate—i.e., electrons for the p-doped substrates here illustrated. In other, equally suitable embodiments, the minority charge carrier may be an electron vacancy, or hole. In such embodiments, the voltages and polarities recited herein should be reversed.

Continuing in FIG. 4, pixel array 416 is operatively coupled to driver 420, which includes suitable logic circuitry ('logic' herein) to address and interrogate the various pixel elements of the array. In general, the driver may be fabricated on the same die as the pixel array or may be arranged elsewhere. In either case, suitable interconnects (not shown in the drawings) are configured to link the driver to various elements arranged on surface 422. Logic 432 of the driver is configured to bias finger gates 426A and 426B in synchronicity with the modulated light pulses from emitter 112. Due to their synchronized bias, the finger gates of adjacent first and second elements of the array—element 424A and element 424B, for example—cycle with unequal phase into and out of a charge-attracting state. In one embodiment, the phase difference between the adjacent finger gates may be 180 degrees. In this configuration, charge is collected at reading node 428A of pixel element 424A and at reading node 428B of pixel element 424B to effect a quantum-efficiency based time-of-flight measurement. In such a measurement, the charge collected by the finger gates may reside a significant length of time under the finger before reaching the reading nodes. Nevertheless, the overall the accuracy of the measurement is preserved. Continuing in FIG. 4, logic 432 may be configured to bias the remaining pairs of adjacent finger gates of the array 416 in like manner. In addition, logic 434 of driver 420 is configured to bias the transfer gates of the array—such as transfer gates 430A and 430B—as further described hereinafter.

Figure 5:
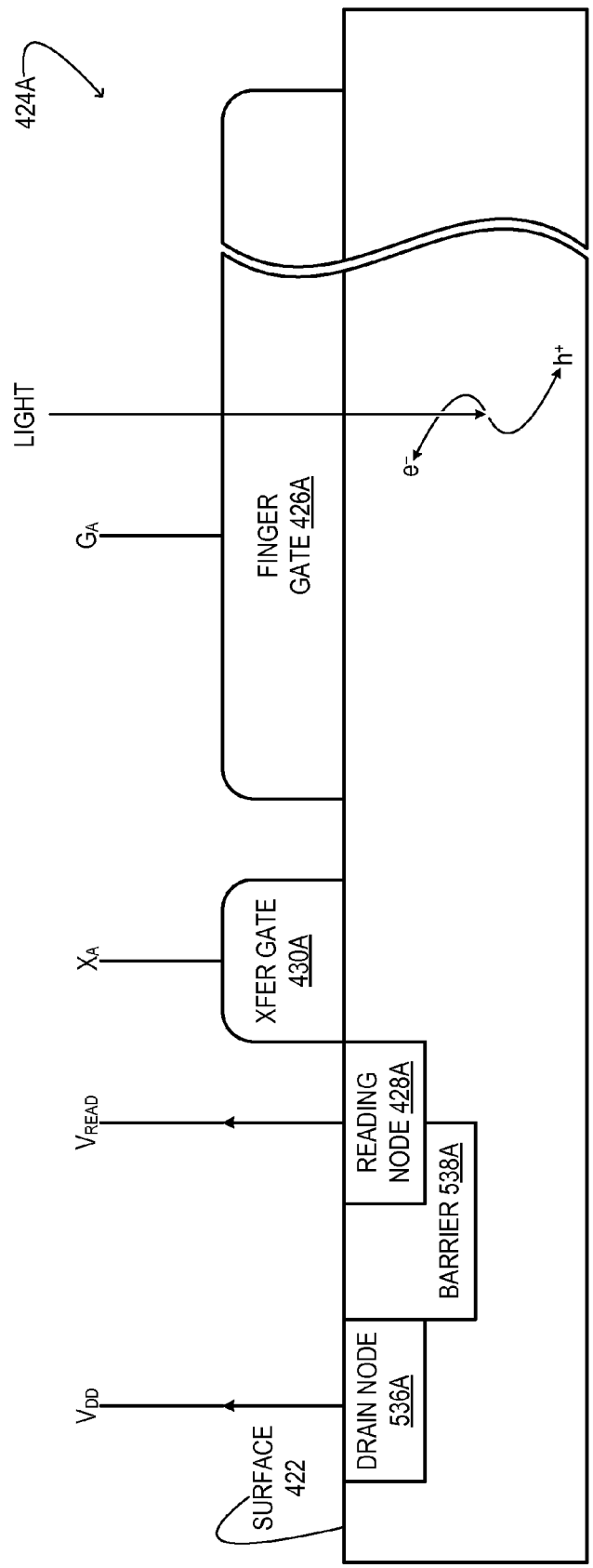
FIG. 5 shows aspects of an example pixel element of a photodetector array in accordance with an embodiment of this disclosure.

FIG. 5 shows aspects of example pixel element 424A in further detail. In this drawing, a drain node 536A is isolated from reading node 428A by barrier 538A. The barrier may be a p-doped material, for instance, whereas the drain node and the reading node may be n-doped. In some embodiments, the barrier may be a polysilicon gate. The drain node is maintained at positive bias to collect the photogenerated charge created by ambient light during the pauses between bursts. It will be noted that the term 'positive bias' is used herein to indicate any voltage greater than zero volts with respect to ground. In some scenarios, positive bias may correspond to the drain-supply voltage level $V_{DD}$, which may be +3.3 volts for some semiconductor architectures. In the embodiment of FIG. 5, drain node 536A has no associated gate; in other embodiments, the drain node may have a gate. In some embodiments, the drain node is maintained at positive bias all the time; in other embodiments the drain node may be maintained at positive bias only during the pause between consecutive bursts, and at a lower bias during the bursts.

Figure 6:
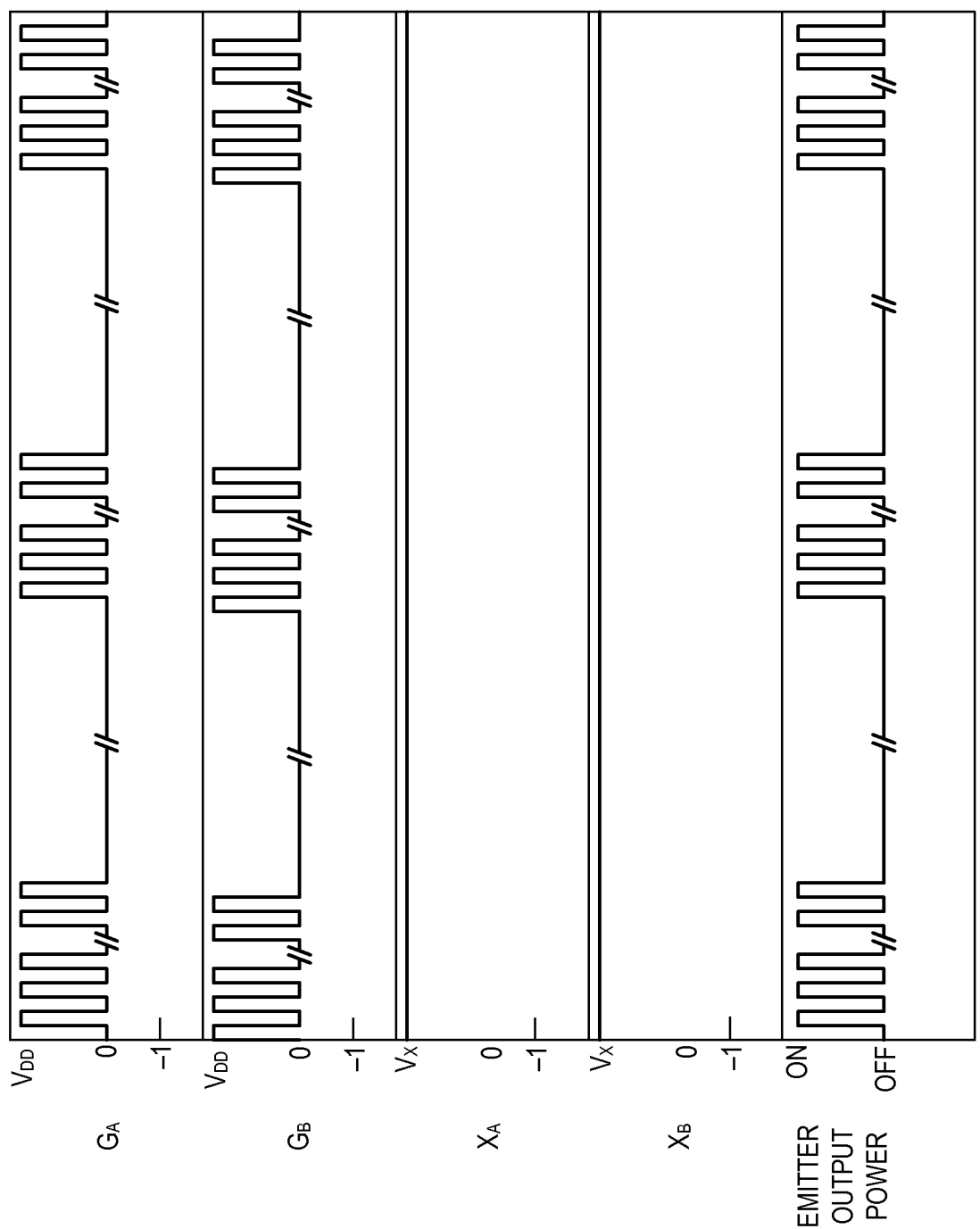
FIG. 6 presents graphs that illustrate a state-of-the-art reference mode for driving a photodetector array.

FIG. 6 is a set of graphs that illustrate a reference mode for driving photodetector array 416. In this mode, positive bias is applied to transfer gates 430A and 430B during bursts from the emitter, and during the pauses between consecutive bursts. Furthermore, finger gates 426A and 426B are maintained at ground bias during the pauses, along with all other finger gates of the array. This mode of operation, presented here as a reference for comparison, permits photogenerated charge created by ambient light during the pauses to diffuse beneath the transfer gate and to be collected at the reading node. Such collection adds noise to the TOF measurement.

Figure 7:
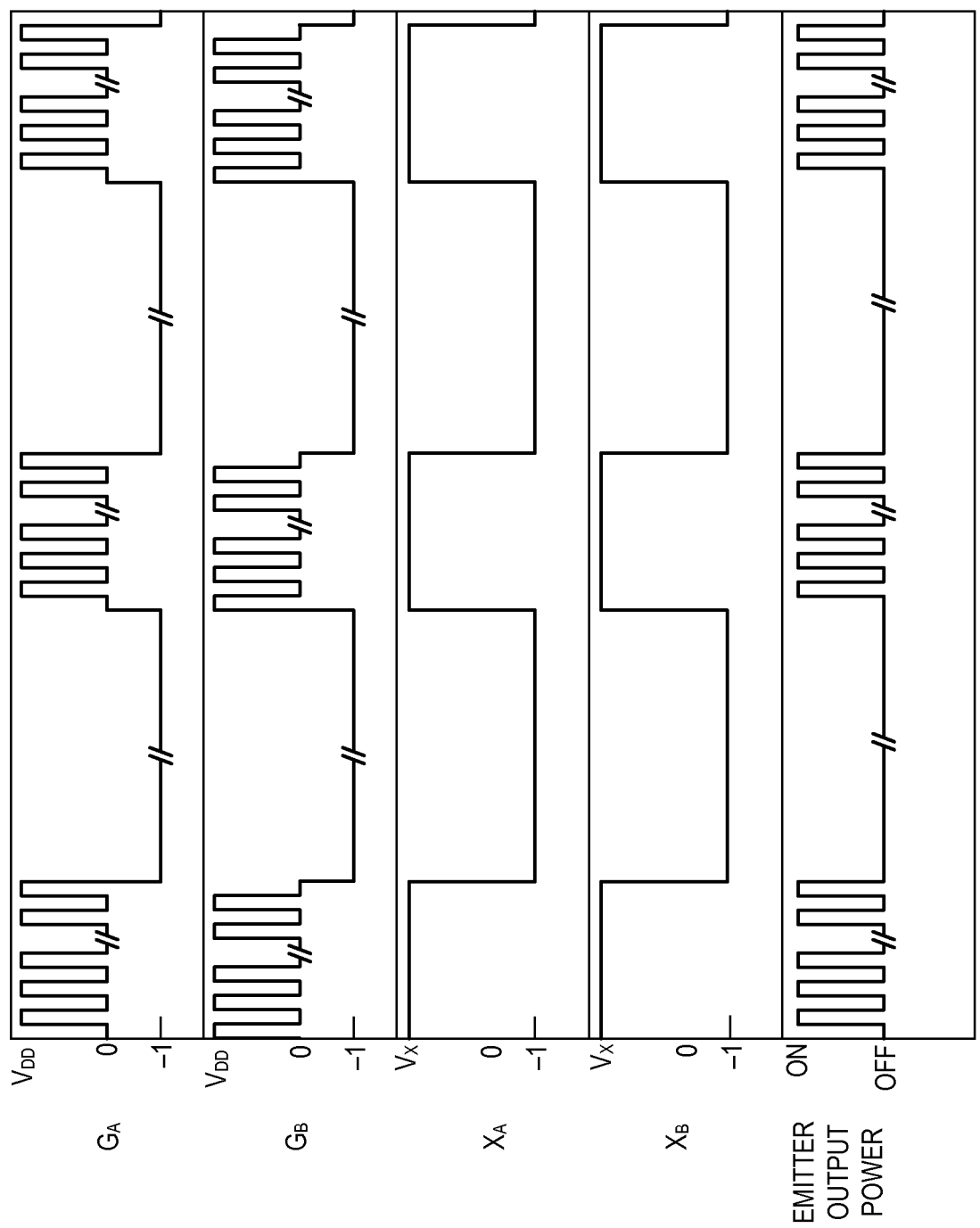
FIG. 7 presents graphs that illustrate an example mode for driving a photodetector array in accordance with an embodiment of this disclosure.

FIG. 7 is a graph that shows another mode for driving photodetector array 416. In this mode, logic 432 is configured to apply preferably negative bias to finger gates of the array during the pauses. This bias repels from surface 422 any photogenerated charge created during the pauses, making it unlikely that such charge will diffuse to the reading nodes or be collected by the finger gates during the pauses. Such charge, if not repelled, would otherwise be subject to collection at the reading node after the pause. Furthermore, logic 434 of driver 420 is configured to bias the transfer gates of the array (e.g., transfer gate 430A and 430B) so that charge is admitted to the corresponding reading nodes (e.g., reading node 428A and 428B) only during the bursts, and is prevented from reaching the reading node during the pauses between bursts. To this end, logic 434 is configured to apply preferably negative bias to the transfer gates during the pauses and positive bias to the transfer gates during the bursts. The negative bias during the pauses repels the photogenerated charge from surface 422, thereby preventing it from diffusing to the reading nodes.

No aspect of the drawings or description herein should be understood in a limiting sense, for numerous other embodiments are envisaged as well. Although pixel 418 of FIG. 4 has only two complementary elements 424A and 424B, other pixel arrays may include as many as six elements per pixel. In such embodiments, the pixel elements may be interdigitated and addressed in two groups (e.g., two groups of three finger gates).

Figure 8:
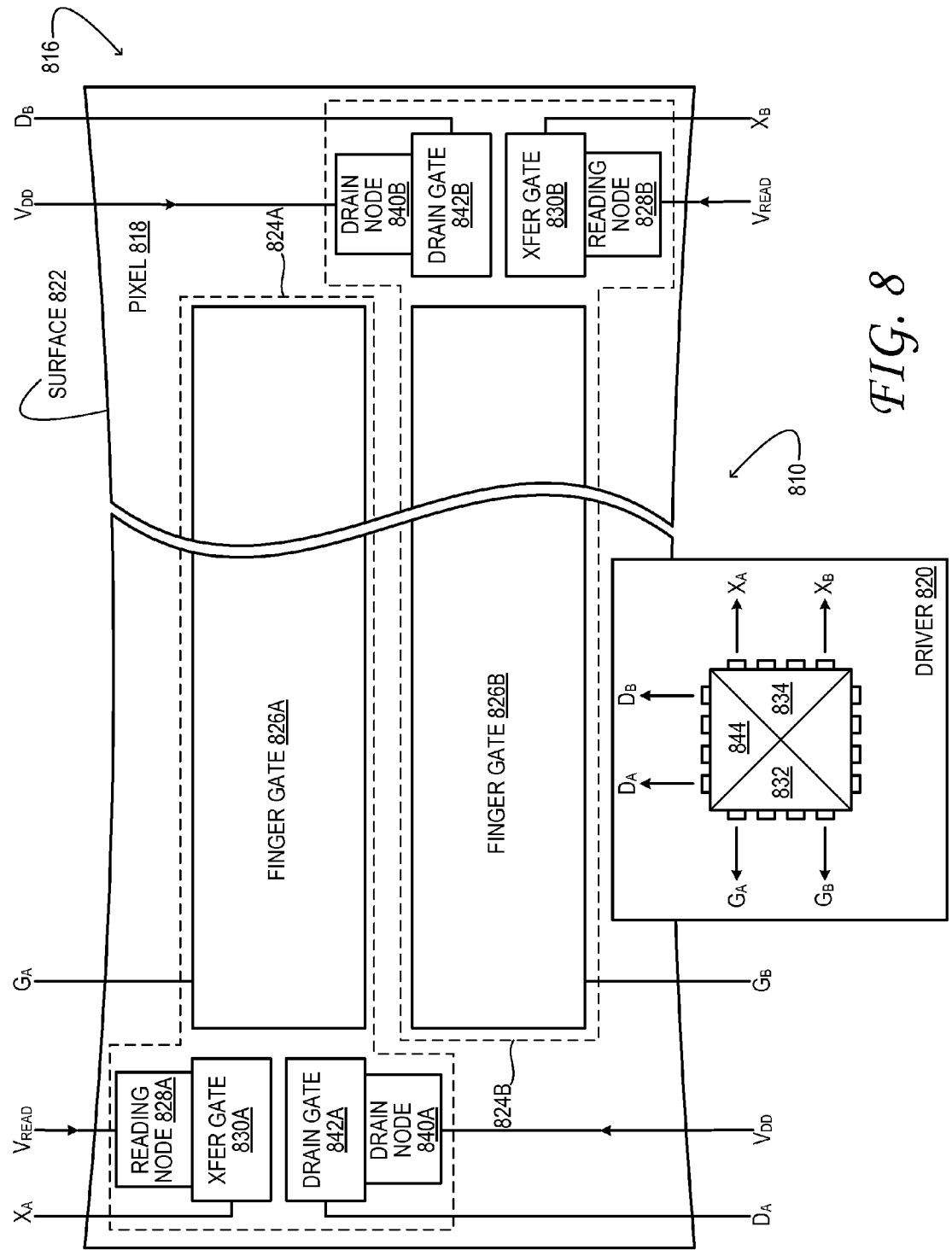
FIGS. 8 and 9 show aspects of other time-of-flight depth imagers in accordance with embodiments of this disclosure.

FIG. 8 shows aspects of another example TOF imager 810 in one embodiment. In this imager, pixel element 824A includes a drain node 840A to drain photogenerated charge from the substrate during the pauses. Pixel element 824A also includes a drain gate 842A biasable to steer such charge toward the associated drain node. In like manner, adjacent pixel element 824B includes drain node 840B and drain gate 842B. In this embodiment, driver 820 includes logic 844 to bias the drain gates of the elements of the array so that charge is steered toward the drain node only during the pauses and is prevented from reaching the drain node during the bursts. In addition, charge may be drained from the finger gates during each pause, which, in turn, prevents the charge (e.g., those collected under the finger) from being undesirably collected by the reading node after the pause.

Figure 9:
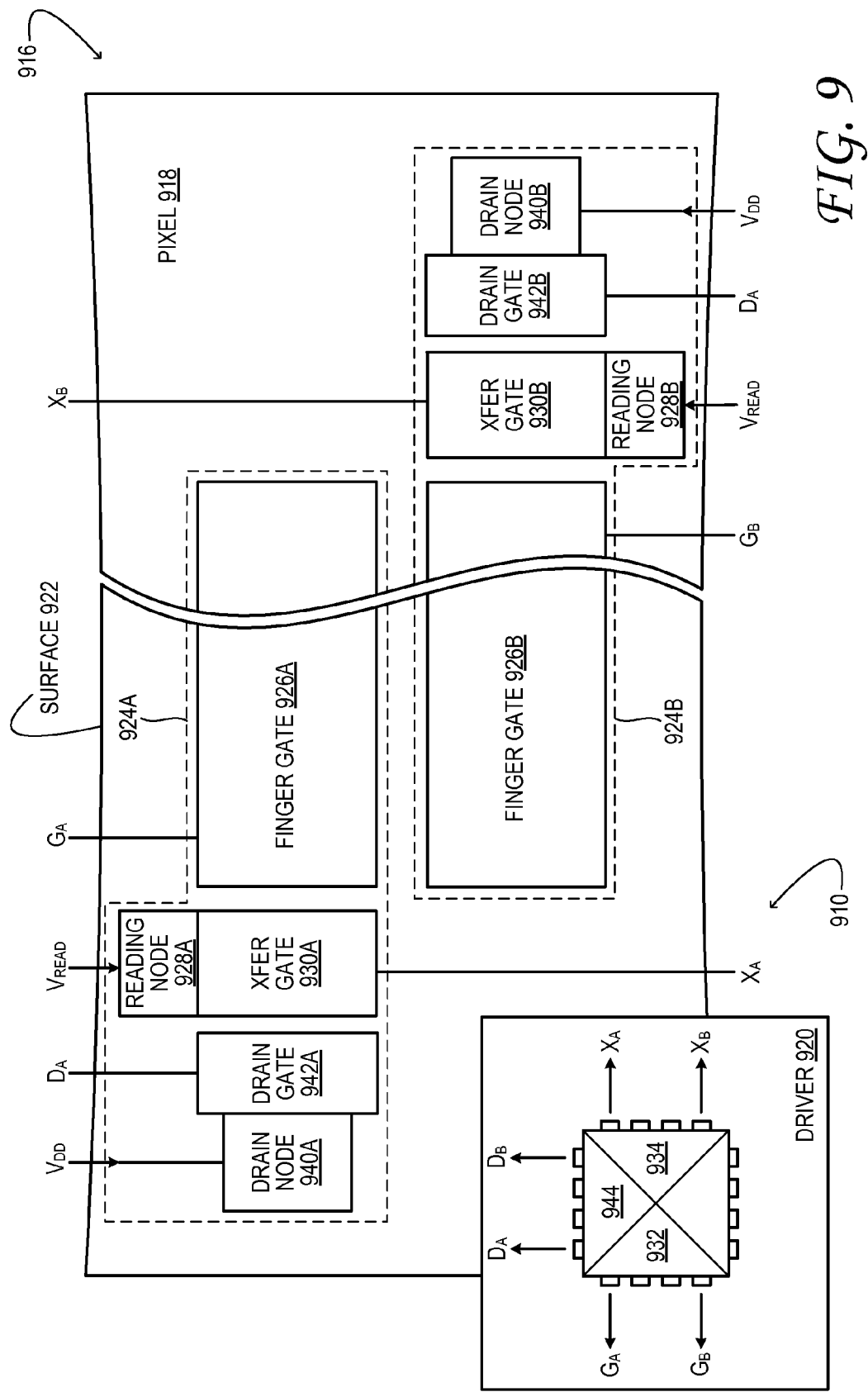
Figure 10:
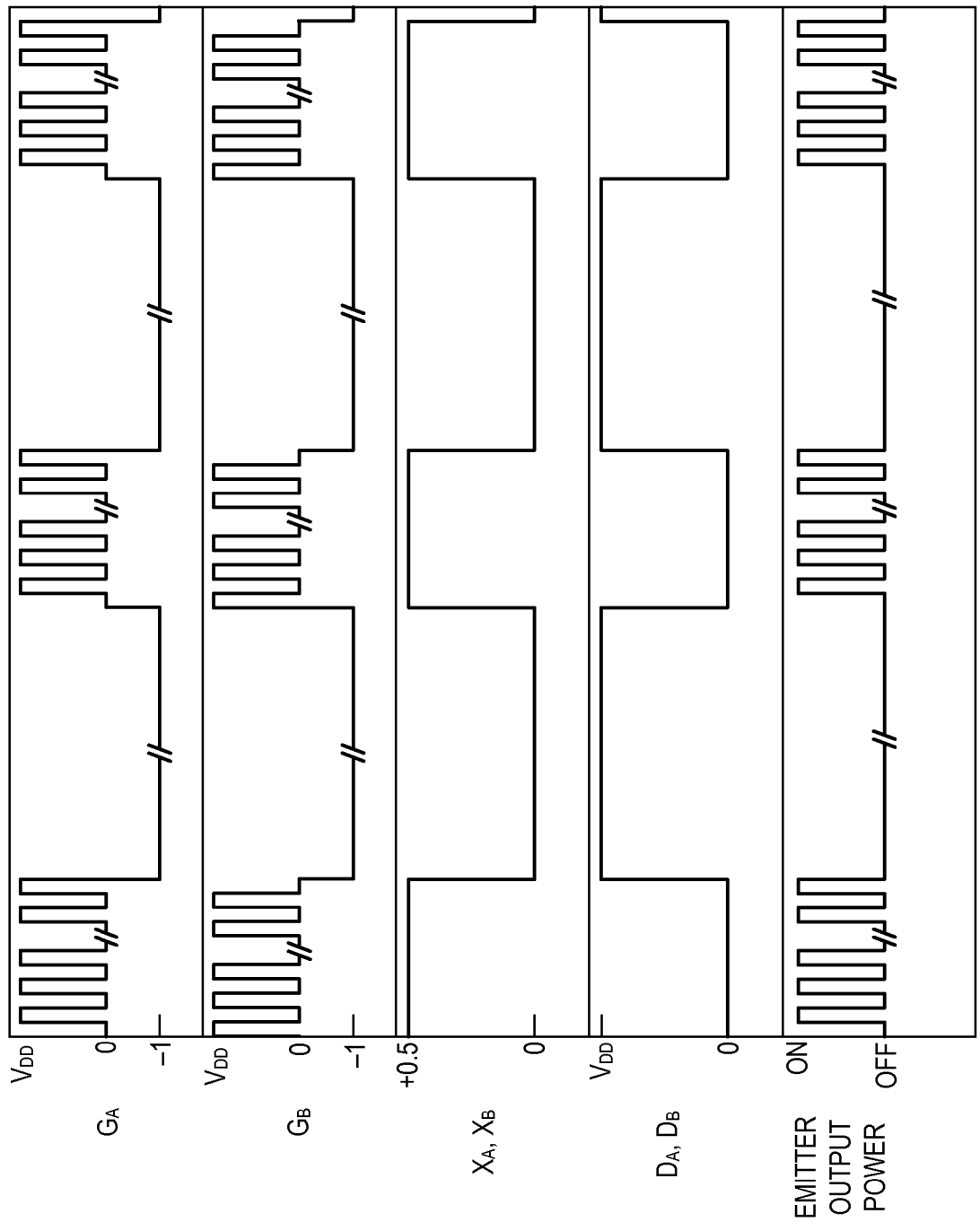
FIG. 10 is a graph illustrating another mode for driving a photodetector array in accordance with an embodiment of this disclosure.

In the embodiment of FIG. 8, transfer gate 830A and drain gate 842A are adjacent each other at one end of finger gate 826A; drain gate 842B and finger gate 826B are arranged in like manner. FIG. 9 shows a similar configuration in which the transfer gate of each pixel element is arranged at one end of the finger gate, and wherein the drain gate is adjacent the transfer gate on the side of the transfer gate opposite the finger gate. In the embodiments of FIGS. 8 and 9, logic 834 and logic 934 are configured to apply ground or negative bias to the transfer gates of the array during the pauses and positive bias during the bursts. Logic 844 and logic 944 are configured to apply ground or negative bias to the drain gates of the array during the bursts and positive bias during the pauses. This mode of operation is illustrated in the graphs of FIG. 10. It will be noted that the values represented by the axis labels of FIG. 10 are examples only. For instance, the drain gate voltages $D_A$ and $D_B$ need not toggle all the way to $V_{DD}$ in every embodiment, but may be modulated to a lesser positive voltage.

Figure 11:
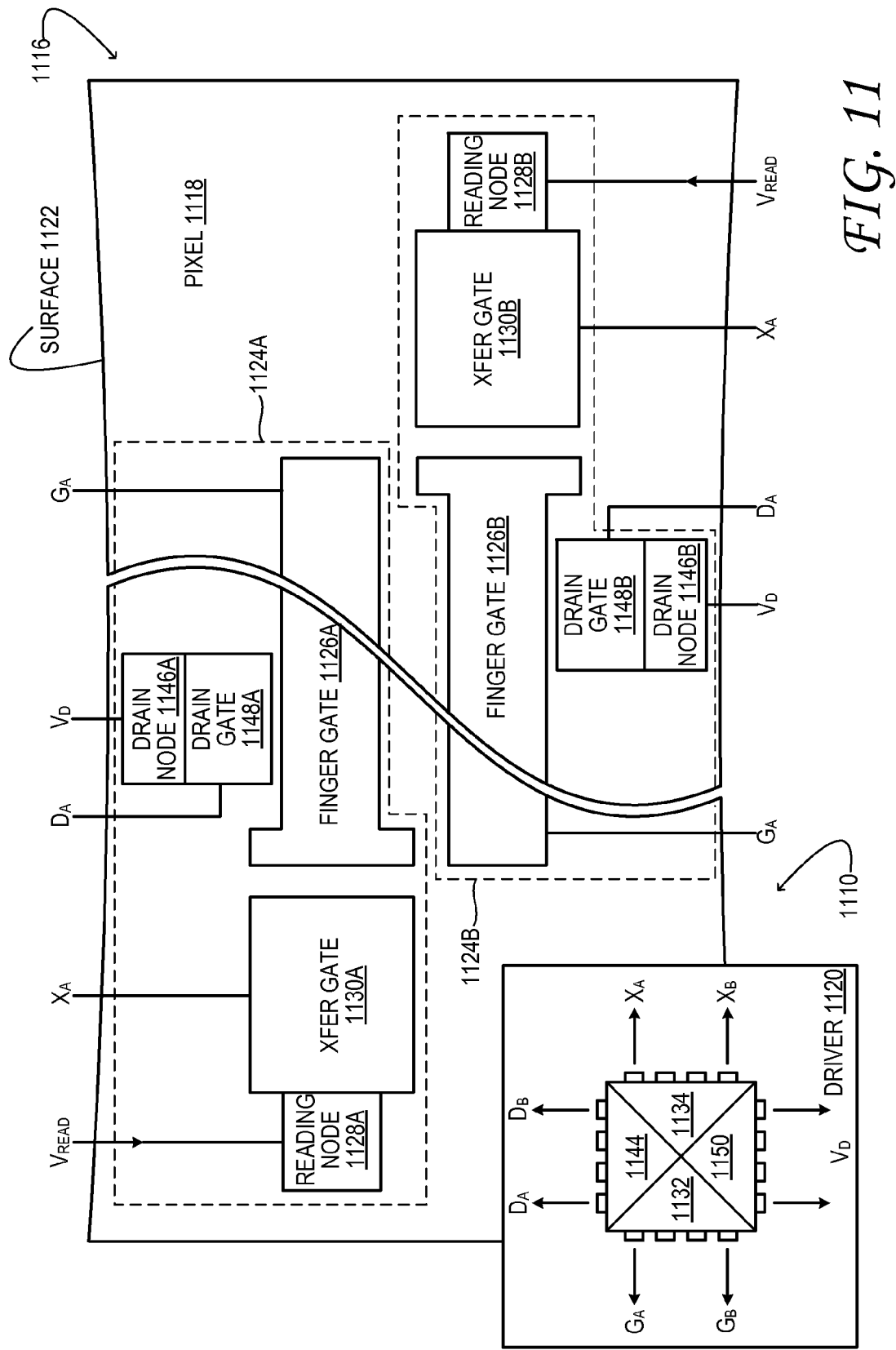
FIG. 11 shows aspects of another time-of-flight depth imager in accordance with an embodiment of this disclosure.

FIG. 11 shows aspects of another example TOF imager 1110 in one embodiment. In this imager, each pixel element 1124A includes a drain node 1146A to drain charge from the substrate during the pauses, and a drain gate 1148A biasable to draw charge away from finger gate 1126A and toward the drain node. In like manner, adjacent pixel element 1124B includes drain node 1146B and drain gate 1148B. Logic 1144 of driver 1120 is configured to bias the drain gates of the elements of the array so that charge is drawn toward the drain node only during the pauses and is prevented from reaching the drain node during the bursts. In the embodiment of FIG. 11, logic 1134 is configured to apply a relatively high positive bias to the transfer gates of the array—transfer gate 1130A and transfer gate 1130B, for example—during the bursts and a lower (preferably ground) bias during the pauses. Logic 1144 is configured to apply positive bias to the drain gates of the array during the pauses and ground bias during the bursts.

Figure 12:
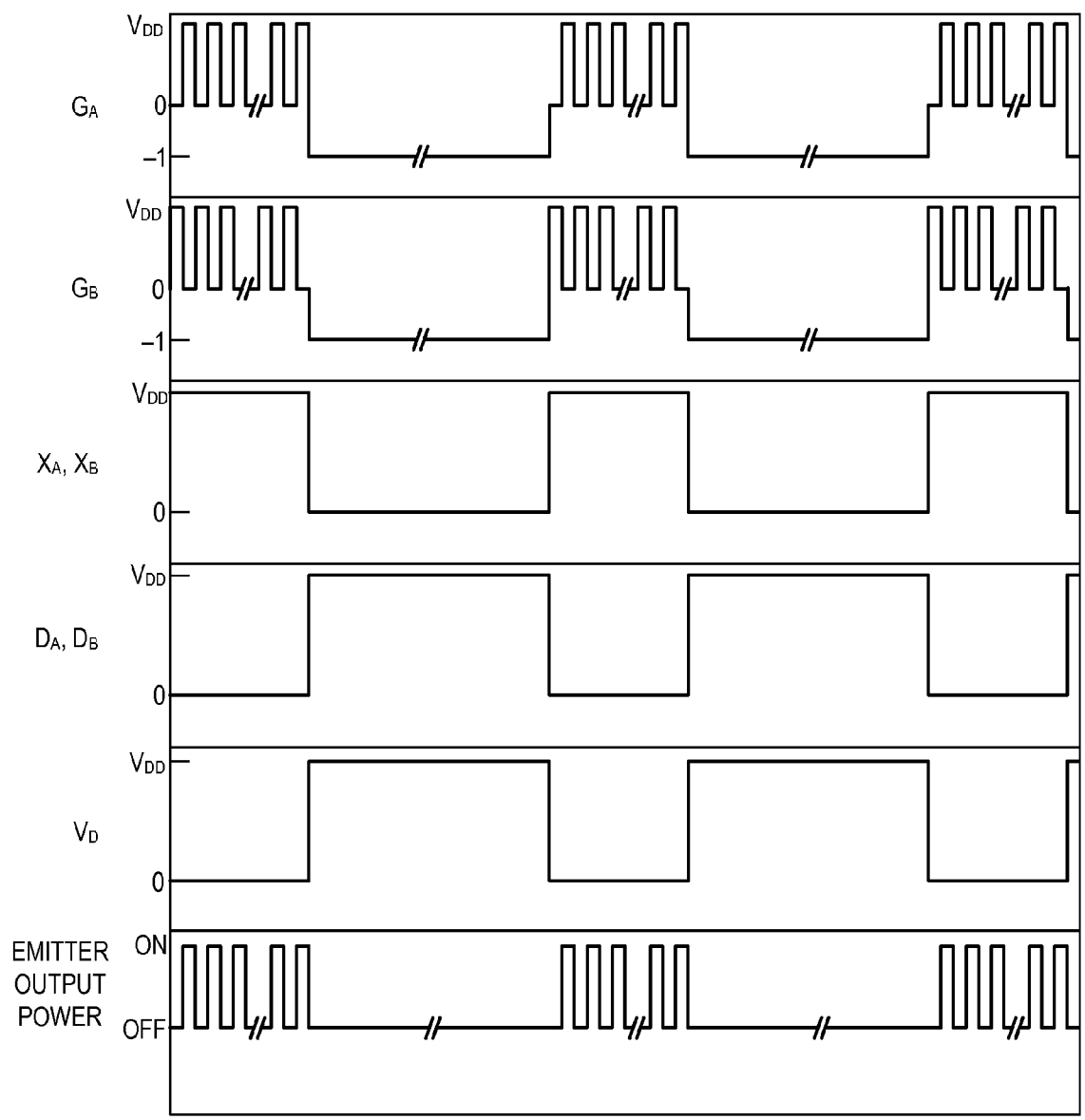
FIG. 12 is a graph illustrating another mode for driving a photodetector array in accordance with an embodiment of this disclosure.

In the embodiment of FIG. 11, driver 1120 also includes logic 1150 to bias drain nodes 1146A and 1146B and other drain nodes of the array. Such logic may be configured to apply lower voltage to the drain nodes during the bursts and higher voltage to the drain nodes during the pauses. In some embodiments, the logic may be configured to impart a high impedance to the path from a given finger gate to an associated drain node during the bursts, and a lower impedance during the pauses. This mode of operation is illustrated in FIG. 12.

Figure 13:
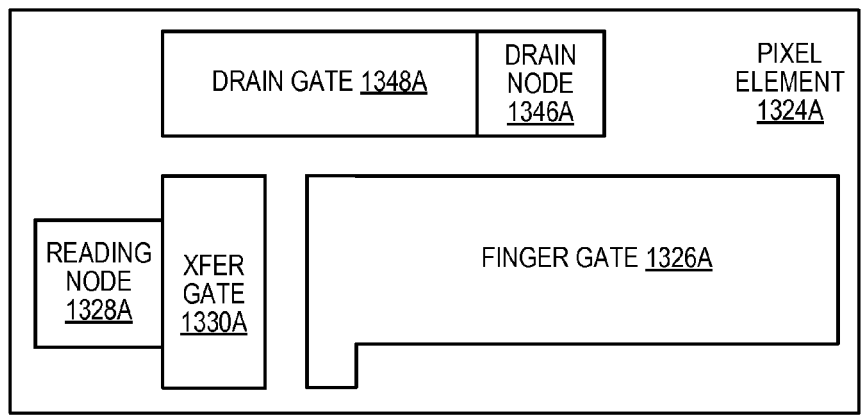
FIGS. 13 through 15 show aspects of example pixel elements of photodetector arrays in accordance with embodiments of this disclosure.
Figure 14:
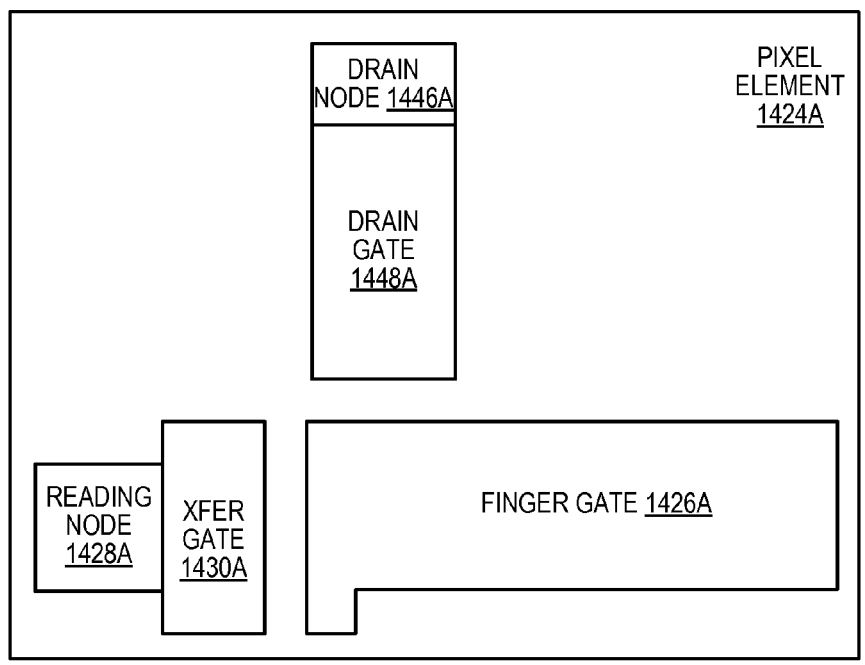
Figure 15:
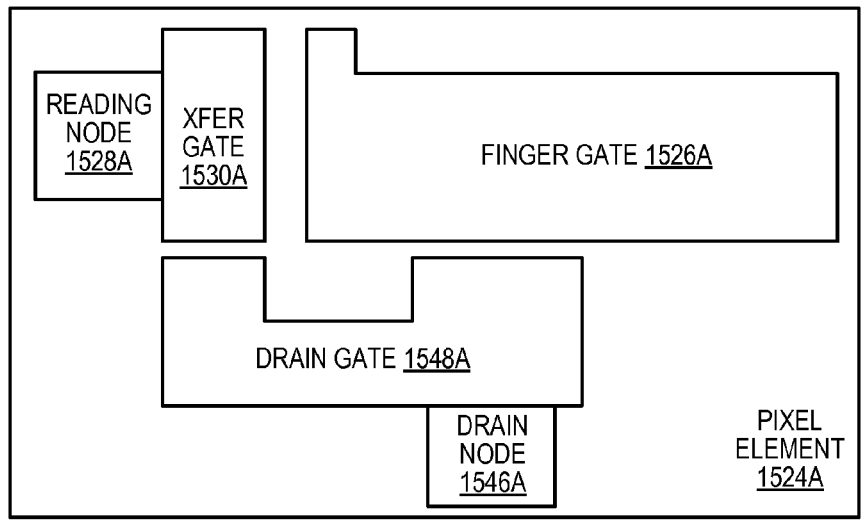

In the embodiment of FIG. 11, drain gate 1148A is arranged adjacent an interior portion of finger gate 1126A of that element; drain gate 1148B and finger gate 1126 are likewise arranged. FIGS. 13 to 15 provide otherwise similar configurations in which the drain nodes and drain gates are configured differently with respect to the associated finger gates and/or transfer gates. In the embodiment of FIG. 13, the drain gate of each pixel element is adjacent the finger gate and the transfer gate of that element. The drain gate extends parallel to the finger gate from a position adjacent an interior portion of the finger gate to a position adjacent the transfer gate. In the embodiment of FIG. 14, the drain gate of each pixel element is adjacent the finger gate of that element. The drain gate extends perpendicular to the finger gate from a position adjacent the end of the finger gate. In the embodiment of FIG. 15, the drain gate is U-shaped, with one arm adjacent an interior portion of the finger gate of that element, and another arm adjacent the transfer gate so as to draw charge away from the transfer gate when the drain gate is under positive bias.

It will be understood that the configurations and/or approaches described herein are exemplary in nature, and that these specific embodiments or examples are not to be considered in a limiting sense, because numerous variations are possible. The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A time-of-flight depth imager comprising:
   an emitter configured to release repeating bursts of modulated light pulses with a pause between consecutive bursts;
   an array of pixel elements formed on a semiconductor surface, each element having a finger gate biasable to attract photogenerated charge to the surface, a reading node to collect the photogenerated charge attracted to the surface, and a transfer gate biasable to admit such charge to the reading node and to deter such charge from being absorbed into the finger gate;
   logic to bias the finger gates of the pixel elements of the array, in synchronicity, during the bursts, with the modulated light pulses from the emitter, and to apply negative bias to the finger gates during the pauses, the finger gates of adjacent first and second pixel elements cycling with unequal phase into and out of a charge-attracting, positive state; and
   logic to bias the transfer gates of the pixel elements of the array so that the photogenerated charge is admitted to the reading node only during the bursts and is prevented from reaching the reading node during the pauses.

2. The depth imager of claim 1 wherein the logic to bias the transfer gates is configured to apply negative bias to the transfer gates during the pauses and positive bias to the transfer gates during the bursts.

3. The depth imager of claim 1 further comprising a drain node isolated from the reading node and maintained at positive bias to collect the photogenerated charge during the pauses.

4. The depth imager of claim 1 wherein the photogenerated charge is collected at the reading node of each pixel element of the array to effect a quantum-efficiency based time-of-flight measurement.

5. The depth imager of claim 1 wherein the emitter is an infrared or near-infrared emitter of narrow emission bandwidth.

6. The depth imager of claim 1 wherein the emitter is a laser.

7. The depth imager of claim 1 wherein each burst lasts 0.5 to 50 microseconds, and wherein each pause lasts 2 to 500 microseconds.

8. A time-of-flight depth imager comprising:
   an emitter configured to release repeating bursts of modulated light pulses with a pause between consecutive bursts;
   an array of pixel elements formed on a semiconductor surface, each pixel element having a finger gate biasable to attract photogenerated charge to the surface, a reading node to collect the photogenerated charge attracted to the surface, a transfer gate biasable to admit such charge to the reading node and to deter such charge from being absorbed into the finger gate, a drain node to drain such charge from the substrate during the pauses, and a drain gate biasable to steer such charge toward the drain node;
   logic to bias the finger gates of the pixel elements of the array, in synchronicity, during the bursts, with the modulated light pulses from the emitter, and to apply negative bias to the finger gates during the pauses, the finger gates of adjacent first and second pixel elements cycling with unequal phase into and out of a charge-attracting, positive state;
   logic to bias the transfer gates of the pixel elements of the array so that the photogenerated charge is admitted to the reading node only during the bursts and is prevented from reaching the reading node during the pauses; and
   logic to bias the drain gates of the pixel elements of the array so that the photogenerated charge is steered toward the drain node only during the pauses and is prevented from reaching the drain node during the bursts.

9. The depth imager of claim 8 wherein the transfer gate and the drain gate of each pixel element are adjacent each other at one end of the finger gate of that element.

10. The depth imager of claim 8 wherein the transfer gate of each pixel element is arranged at one end of the finger gate, and wherein the drain gate is adjacent the transfer gate on a side of the transfer gate opposite the finger gate.

11. The depth imager of claim 8 wherein the logic to bias the transfer gates is configured to apply ground or negative bias to the transfer gates during the pauses and positive bias during the bursts.

12. The depth imager of claim 8 wherein the logic to bias the drain gates is configured to apply ground or negative bias to the drain gates during the bursts and positive bias during the pauses.

13. The depth imager of claim 12 wherein the drain gate of each pixel element is adjacent the finger gate and the transfer gate of that element, wherein the drain gate extends parallel to the finger gate from a position adjacent an interior portion of the finger gate to a position adjacent the transfer gate.

14. A time-of-flight depth imager comprising:
   an emitter configured to release repeating bursts of modulated light pulses with a pause between consecutive bursts;
   an array of pixel elements formed on a semiconductor surface, each pixel element having a finger gate biasable to attract photogenerated charge to the surface, a reading node to collect the photogenerated charge attracted to the surface, a transfer gate at one end of the finger gate biasable to admit such charge to the reading node and to deter such charge from being absorbed into the finger gate, a drain node to drain such charge from the substrate during the pauses, and a drain gate biasable to draw such charge away from the finger gate and toward the drain node;
   logic to bias the finger gates of the pixel elements of the array in synchronicity with the modulated light pulses from the emitter, the finger gates of adjacent first and second pixel elements cycling with unequal phase into and out of a charge-attracting state;
   logic to bias the transfer gates of the pixel elements of the array so that the photogenerated charge is admitted to the reading node only during the bursts and is prevented from reaching the reading node during the pauses; logic to bias the drain gates of the pixel elements of the array so that the photogenerated charge is drawn toward the drain node only during the pauses and is prevented from reaching the drain node during the bursts; and
   logic to bias the drain nodes, such logic configured to impart a high impedance to a path from a given finger gate to an associated drain node during the bursts, and a lower impedance to the path from the finger gate to the associated drain node during the pauses.

15. The depth imager of claim 14 wherein the drain gate of each pixel element is arranged adjacent an interior portion of the finger gate of that element.

16. The depth imager of claim 14 wherein the drain gate of each pixel element is adjacent the finger gate of that element, wherein the drain gate extends perpendicular to the finger gate from a position adjacent the end of the finger gate.

17. The depth imager of claim 14 wherein the drain gate is U-shaped, with one arm adjacent an interior portion of the finger gate of that element, and another arm adjacent the transfer gate so as to draw charge away from the transfer gate when the drain gate is under positive bias.

18. The depth imager of claim 14 wherein the logic to bias the transfer gates is configured to apply positive bias to the transfer gates during the bursts and ground bias during the pauses, and wherein the logic to bias the drain gates is configured to apply positive bias to the drain gates during the pauses and ground bias during the bursts.

* * * * *